United States Patent
Jeon et al.

(10) Patent No.: US 8,611,484 B2
(45) Date of Patent: Dec. 17, 2013

(54) RECEIVER HAVING CLOCK RECOVERY UNIT BASED ON DELAY LOCKED LOOP

(75) Inventors: Hyun-Kyu Jeon, Daejeon-si (KR); Yong-Hwan Moon, Incheon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 0 days.

(21) Appl. No.: 12/920,550

(22) PCT Filed: Feb. 9, 2010

(86) PCT No.: PCT/KR2010/000780
§ 371 (c)(1),
(2), (4) Date: Sep. 1, 2010

(87) PCT Pub. No.: WO2010/093158
PCT Pub. Date: Aug. 19, 2010

(65) Prior Publication Data
US 2011/0286562 A1    Nov. 24, 2011

(30) Foreign Application Priority Data

Feb. 13, 2009    (KR) .................. 10-2009-0011727

(51) Int. Cl.
*H04L 7/02*    (2006.01)
(52) U.S. Cl.
USPC ........................................ 375/360
(58) Field of Classification Search
USPC .................. 375/326, 327, 359, 360, 361
See application file for complete search history.

(56) References Cited

U.S. PATENT DOCUMENTS

| 2002/0186087 | A1  | 12/2002 | Kim et al. |
| 2008/0024180 | A1  | 1/2008  | Park et al. |
| 2008/0080649 | A1* | 4/2008  | Gibbons et al. ............... 375/355 |
| 2009/0167750 | A1* | 7/2009  | Hong et al. ................... 345/213 |
| 2009/0189656 | A1* | 7/2009  | Huang .......................... 327/158 |

FOREIGN PATENT DOCUMENTS

| CN | 101222457    | 7/2008 |
| JP | 2000-224029  | 8/2000 |
| JP | 2007-193305  | 8/2007 |
| JP | 2008-72597   | 3/2008 |
| JP | 2008-072597 A | 3/2008 |
| JP | 2009-048154  | 3/2009 |
| JP | 2009-163239  | 7/2009 |
| JP | 2009-531936  | 9/2009 |

(Continued)

OTHER PUBLICATIONS

PCT International Search Report, Application No. PCT/KR2010/000780, dated Aug. 31, 2010.
PCT Written Opinion of the International Searching Authority, Application No. PCT/KR2010-00780, dated Aug. 31, 2010.
Abdulkerim L. Coban, et al., "A 2.5-3.125-Gb/s Quad Transceiver with Second-Order Analog DLL-Based CDRs", IEEE Journal of Solid State Circuits, vol. 40, No. 9, Sep. 2005, pp. 1940-1947.

*Primary Examiner* — Kevin Kim
(74) *Attorney, Agent, or Firm* — Kile Park Reed & Houtteman PLLC

(57) ABSTRACT

A receiver for receiving an input signal (a clock-embedded data (CED) signal), in which a clock signal is periodically embedded between data signals, includes a clock recovery unit configured to recover and output the clock signal and a serial-to-parallel converter configured to recover and output a data signal. The input signal (the CED signal) comprises a single level signal in which the clock signal is periodically embedded between the data signals at the same level. The clock recovery unit is configured based on a delay locked loop (DLL) without using an internal oscillator for generating a reference clock signal.

15 Claims, 5 Drawing Sheets

(56) References Cited

FOREIGN PATENT DOCUMENTS

| | | |
|---|---|---|
| JP | 2009-230139 | 10/2009 |
| KR | 100186433 B1 | 12/1998 |
| KR | 2003-0052667 | 6/2003 |
| KR | 1020030052667 A | 6/2003 |
| KR | 1020080011834 A | 2/2008 |
| KR | 1020080066327 A | 7/2008 |
| KR | 10-0868299 B1 | 11/2008 |
| KR | 10-2010-0043452 A | 4/2010 |
| WO | 2007/035015 | 3/2007 |
| WO | 2007/108574 | 9/2007 |

* cited by examiner

RECEIVER HAVING CLOCK RECOVERY UNIT BASED ON DELAY LOCKED LOOP

BACKGROUND OF THE INVENTION

1. Field of the Invention

The present invention relates to a receiver of a display driving system, and more particularly, to a receiver having a clock recovery unit based on a delay locked loop, wherein a PLL (phase locked loop) structure is excluded and a clock recovery unit realized using only a DLL (delay locked loop) structure without using a separate oscillator for generating a conventional reference clock signal is employed so that a clock signal embedded between data signals having the same level and amplitude as the data signal can be recovered.

2. Description of the Related Art

In general, display devices include a timing controller which processes image data and generates a timing control signal so as to drive a panel for displaying the image data, and data drivers which drive the panel using the image data and the timing control signal transmitted from the timing controller.

Interfaces for transmitting image data to be displayed, between the timing controller and the data driver, include a multi-drop signaling interface, in which the data drivers share a data signal line and a clock signal line, a PPDS (point-to-point differential signaling) interface, in which data differential signals and clock differential signals are separately supplied to the respective data drivers, and an interface, in which data and clock signals are separated into multiple levels and data differential signals with the clock signals embedded therein are transmitted from the timing controller through independent signal lines to the data drivers.

The present applicant has proposed an interface in Korean Patent Application No. 10-2008-0102492, in which a single level signal with a clock signal embedded between data signals (LVDS data) to the same level is used and data and a clock signal are transmitted together by an independent single signal line so that the data and the clock signal can be recovered by a receiver.

In the interface for transmitting data differential signals with clock signals embedded therein to the data drivers by respective independent signal lines, a transmitter generates a transmission signal that corresponds to respective data bits and transits periodically. The periodic transition can occur by dummy bits that are inserted between data bits of a predetermined number. That is to say, the periodic transition occurs due to the fact that a portion immediately before and after the data bits to be transmitted has a value different from the data bits. In this case, since a receiver provided in the data driver cannot receive a separate clock signal, in order to receive the data differential signals with the embedded clock signals and recover original data, the clock signals embedded between the data signals should be recovered from the received differential signals.

Therefore, the receiver should be provided with a recovery circuit for recovering the clock signals, and it is the norm in the conventional art that such a clock recovery circuit is configured to have a phase locked loop (PLL) structure. That is to say, because a reference clock signal as a clock signal generated by oscillation inside the receiver is needed to recover the received data, it is the norm that the clock signal recovery unit is configured by the phase locked loop (PLL) which has an oscillator for generating the reference clock signal.

As is disclosed in Korean Patent No. 868299, a conventional receiver provided in the data driver includes a clock generation unit which is configured to generate a received clock signal from the periodic transition of a differential signal received through a signal line, and a sampler which is configured to sample the differential signal according to the received clock signal and recover data bits.

The clock generation unit includes a transition detecting circuit configured to output a signal corresponding to a time difference between the periodic transition of the received differential signal and the transition of a feedback clock signal, and an oscillator configured to change the phases of the feedback clock signal and the received clock signal in response to the signal outputted from the transition detecting circuit.

The transition detecting circuit is configured in such a manner that the oscillation frequency of the oscillator is determined by the clock signal inputted upon initial synchronization and the operation of a transition detector is interrupted or restarted in response to an enable signal when data is inputted thereafter. In this case, while the enable signal is generated by the clock signal inputted upon the initial synchronization, since there is no clock edge during a time interval excluding the interval of the enable signal, no influence is exerted on the generation of the received clock signal.

Therefore, the clock generation unit is configured in such a manner that only the rising edge or the falling edge of the received signal composed of the dummy bits is recognized as a transition during an interval in which the enable signal has a high logic level and is not recognized as a transition during an interval in which the enable signal has a low logic level, so that the frequency and the phase of the received clock signal generated by the oscillator deviate from the periodic transition by the dummy bits.

Thus, the conventional clock generation unit is configured based on the phase locked loop (PLL) structure having a characteristic that the feedback signal in the oscillator is inputted again to the oscillator after the initial synchronization to generate the enable signal.

However, the conventional clock generation unit configured based on the phase locked loop (PLL) structure has a problem in that jitter continuously accumulates in the phase lock loop (PLL) as an internal feedback loop.

Also, the conventional clock generation unit may be configured to have not only the characteristic of a delay locked loop (DLL) in that the received signal is directly inputted to the oscillator in the initial synchronization to generate the enable signal but also the characteristic of the phase locked loop (PLL) in that the feedback signal in the oscillator is inputted to the oscillator after the initial synchronization to generate the enable signal.

Nevertheless, the conventional clock generation unit, which is configured to operate by the delay locked loop (DLL) structure in the initial synchronization and by the phase lock loop (PLL) structure after the initial synchronization, has a problem in that the oscillation frequency and the phase are likely to be distorted due to the change of the loop during operation.

Further, since the enable signal is generated by the phase locked loop (PLL) structure after the initial synchronization, a problem is still caused in that jitter continuously accumulates in the phase locked loop (PLL) as an internal feedback loop.

SUMMARY OF THE INVENTION

The technical problem to be solved by the present invention is to provide a receiver having a clock recovery unit based on a delay locked loop that recovers a clock signal periodically embedded between data signals of a clock-embedded data (CED) signal by using only a delay locked loop and prevents jitter from accumulating due to continuous transmission of the clock signal through a feedback loop.

A receiver having a clock recovery unit based on a delay locked loop comprises a clock recovery unit configured to recover and output the clock signal and a serial-to-parallel converter configured to recover and output a data signal, wherein the clock recovery unit is characterized by receiving a clock embedded data signal in which only the clock signal is included during a clock training interval and the clock periodically embedded between the data signals after the clock training interval, generating a first master clock signal from the clock embedded data signal during the clock training interval and generating a second master clock signal from the clock embedded data signal after the clock training interval, after the training interval, generating the second master clock signal by a first delay clock signal that delays the first master clock signal so as to have a phase difference and then generating the second master clock signal by a second delay clock signal that delays the second master clock signal so as to have a phase difference, and providing a recovery clock signal from the second delay clock signals.

EFFECT OF THE INVENTION

The present application has advantages in recovering a clock signal transmitted while being embedded between data signals having the same level and amplitude as the data signal by using a clock recovery unit configured based only on a delay locked loop, preventing jitter from accumulating owing to a feedback loop in a phase locked loop, and preventing disturbance from occurring in an oscillating frequency and a phase due to mixed use of a delay locked loop and a phase locked loop.

BRIEF DESCRIPTION OF THE DRAWINGS

The above objects, and other features and advantages of the present invention will become more apparent after a reading of the following detailed description taken in conjunction with the drawings, in which.

THE DESCRIPTION OF REFERENCE NUMERALS

Figure 1:
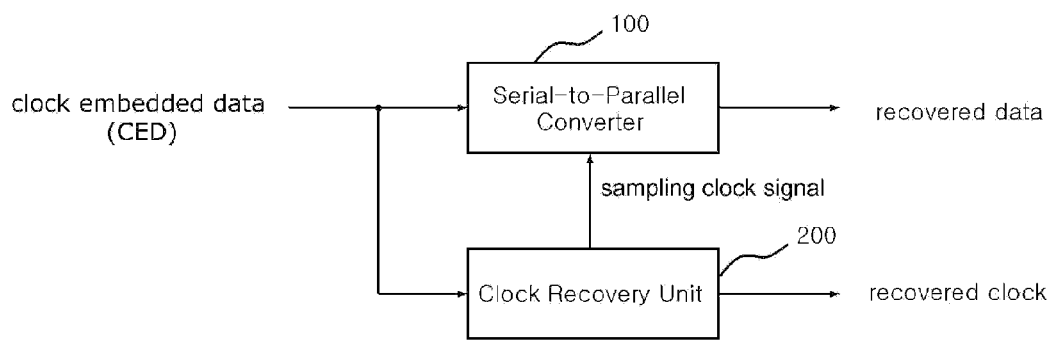
FIG. 1 is a block diagram illustrating a preferable embodiment of a receiver having a clock recovery unit based on a delay locked loop in accordance with an embodiment of the present invention.

100—a serial-to-parallel converter
200—a clock recovery unit
210—a clock generator
211—a mask signal generator
212—a pass switch
213—a cutoff switch
214—a pull-up section
215—a pull-down section
216—a first switch
217—a second switch
220—a voltage-controlled delay line
230—a phase difference detector
224—a low pass filter

DETAILED DESCRIPTION OF PREFERRED EMBODIMENT

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a block diagram illustrating a receiver for receiving a clock embedded data signal with an embedded clock signal in accordance with an embodiment of the present invention.

Referring to FIG. 1, a receiver for receiving a clock embedded data signal embedded with a clock signal includes a serial-to-parallel converter 100 configured to receive a clock embedded data (clock embedded data: CED) signal transmitted through a serial signal line from a timing controller, convert clock embedded data signal into parallel data and transmit recovered data to a display panel, and a clock recovery unit 200 configured to extract a clock signal embedded in the clock embedded data signal (CED), transmit to the serial-to-parallel converter 100 a sampling clock signal to be used for the recovery of the data signal and output a recovery clock signal to be used for the output of data.

The present invention is for solving the problems caused in a clock recovery unit configured based on a phase locked loop (PLL) due to the fact that jitter continuously accumulates as a clock signal generated in the clock recovery unit passes through an internal feedback loop. The present invention suggests the clock recovery unit 200 configured only using a delay locked loop (DLL) in which jitter does not continuously accumulate, so that a clock signal embedded in a clock embedded data (CED) signal can be recovered by the receiver without using an oscillator for generating a conventional reference clock signal. In this regard, since the other component parts of the receiver, such as the serial-to-parallel converter 100, excluding the clock recovery unit 200 can be configured similarly to a conventional receiver for receiving a clock embedded data (CED) signal and implementing recovery, the configuration of the clock recovery unit 200 which is formed based only on the delay locked loop (DLL) will be described below in detail.

The clock embedded data (CED) signal to be received by the receiver is a signal in which a clock signal is embedded between data signals to be transmitted, and is transmitted from the timing controller through the signal line to a data driver. At this time, while it is preferred for the clock embedded data (CED) signal that the clock signal has the same level and amplitude as the data signal and is embedded between the data signals, it is to be understood that the clock signal can be embedded at multiple levels. The clock embedded data (CED) signal as an input signal received by the receiver through the signal line may comprise one differential signal or a single-ended signal.

Also, a clock embedded data (CED) signal may include only a clock signal or it may be a signal embedded in a data signal.

Therefore, in case a clock signal is included in a clock embedded data (CED) signal in the specification of the present invention, it is distinguished as "a first clock embedded data signal" and in case a clock signal is embedded in a data signal, it is distinguished as "a second clock embedded data (CED) signal." And, in case there is no need to distinguish signals, it is collectively referred to as "a clock embedded data (CED) signal."

Figure 2:
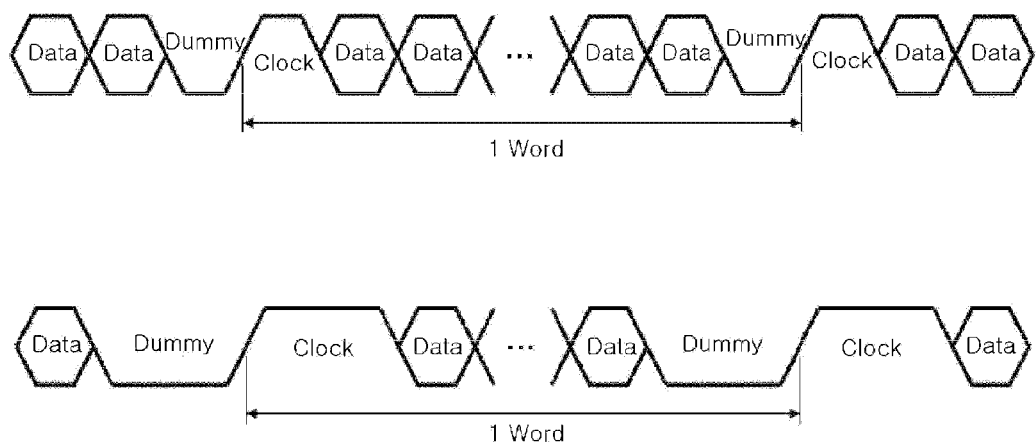
FIG. 2 is of exemplary views showing transmission data composed of clock embedded data (CED) signals with embedded clock signals in accordance with the embodiment of the present invention.

FIG. 2 is of exemplary views showing transmission data composed of clock embedded data (CED) signals with embedded clock signals in accordance with the embodiment of the present invention.

Referring to FIG. 2, the clock embedded (CED) signal periodically inserts clock signals of the same level between data bits and inserts a dummy bit between data signals and clock signals to so as to represent the rising edge or the falling edge of the inserted clock signals. At this time, it is of course possible to increase the width of the dummy signals and the clock signals so as to ease circuit design.

The timing controller transmits clock embedded data (CED) signal comprising only the clock signal before transmitting data signal, thereby starting clock training. The data driver generates a first master clock signal to be used for a recovery of embedded clock signals in response to a first clock embedded data (CED) signal transmitted during a clock training interval. LOCK signals $LOCK_1$~$LOCK_N$ is transited to an "H" state when a first master clock signal (MCLK) is stabilized.

The timing controller ends the clock training after the lapse of a predetermined time and starts the transmission of a second clock embedded data (CED) signal including data signals and clock signals. If the LOCK signal is transited to an "L" state (a low logic state) during the transmission of the data, the timing controller immediately restarts the clock training and maintains the clock training for a preset time.

Figure 3:
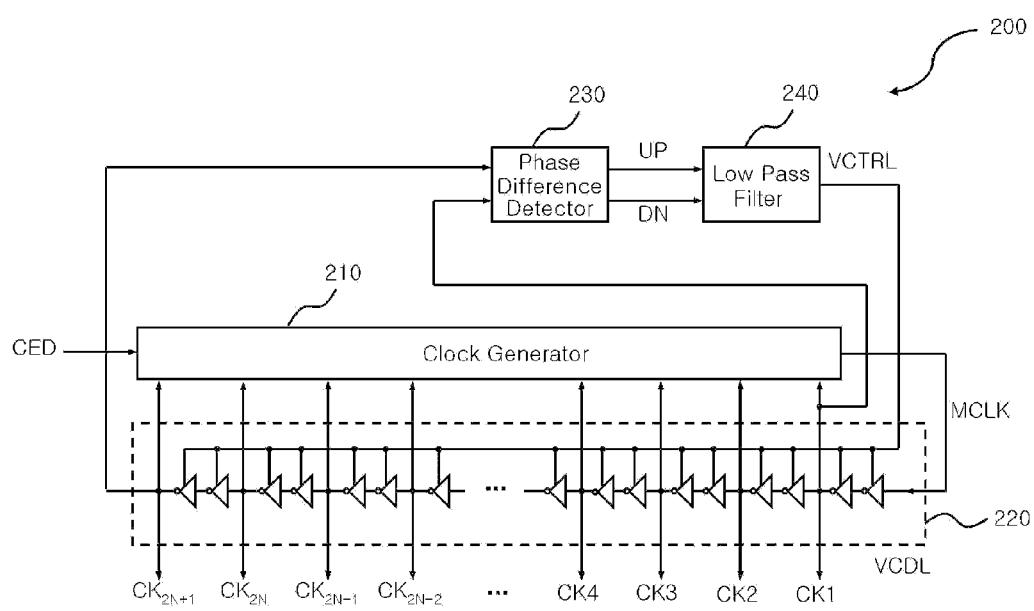
FIG. 3 is a configurational view of a clock recovery unit in accordance with the embodiment of the present invention.

FIG. 3 is a configurational view of a clock recovery unit in accordance with the embodiment of the present invention.

Referring to FIG. 3, the clock recovery unit 200 is configured based on the delay locked loop (DLL) and is configured based on the delay locked loop (DLL) that provides delay clock signals to recover the clock signal from the clock embedded data (CED) signal transmitted from a transmitter, and to generate at least one sampling clock signal and the recovery clock signal to be used for the detection of data signal.

A clock recovery unit 200 is configured to include a clock generator 210 configured to generate a master clock signal (MCLK) from the clock embedded data (CED) signal, a delay line 220 configured to delay the master clock signal MCLK generated in the clock generator 210 and output delay clock signals having various phases depending upon delay amounts; a phase difference detector 230 configured to compare the delay clock signals from the delay line 220 and detect phase differences or time differences; and a low pass filter 240 configured to generate a delay controlled signal VCTRL depending upon a comparison result from the phase difference detector 230 and supply the delayed signal to the delay line 220.

The clock generator 210 is configured to generate a mask signal MASK, a pull-up signal PU or a pull-down signal PD in response to at least one signal among various delayed clock signals outputted from the delay line 220 and recover the clock signal embedded between the data signals. Therefore, the clock generator receives as an input the delayed clock signals $CK_1$, $CK_2$ ... $CK_{2N+1}$ outputted from the delay line 220, and generates a first master clock signal MCLK by the clock embedded data (CED) signal inputted during the clock training interval before the delayed clock signals $CK_1$, $CK_2$ ... $CK_{2N+1}$ are generated. At this time, the number of the delayed clock signals should be at least equal to or greater than 2N+1, where N is a natural number that indicates the number of data bits existing between clock bits that are periodically embedded.

In the embodiment of the present invention, the master clock signal (MCLK) generated during the clock training interval is described as a first master clock signal (MCLK), a master clock signal (MCLK) generated after the clock training interval is described as a second master clock signal (MCLK), and in case of collectively referring to them, they are described as a master clock signal (MCLK).

Also, in the embodiment of the present invention, delayed clock signals $CK_1$, $CK_2$ ... $CK_{2N+1}$ outputted by a first master clock signal (MCLK) from the delay line 220 are described as a first delay clock signal, delayed clock signals $CK_1$, $CK_2$ ... $CK_{2N+1}$ outputted by a second master clock signal (MCLK) from the delay line 220 are described as a second delay clock signal, and in case of collectively referring them, they are described as delay clock signals.

Figure 4:
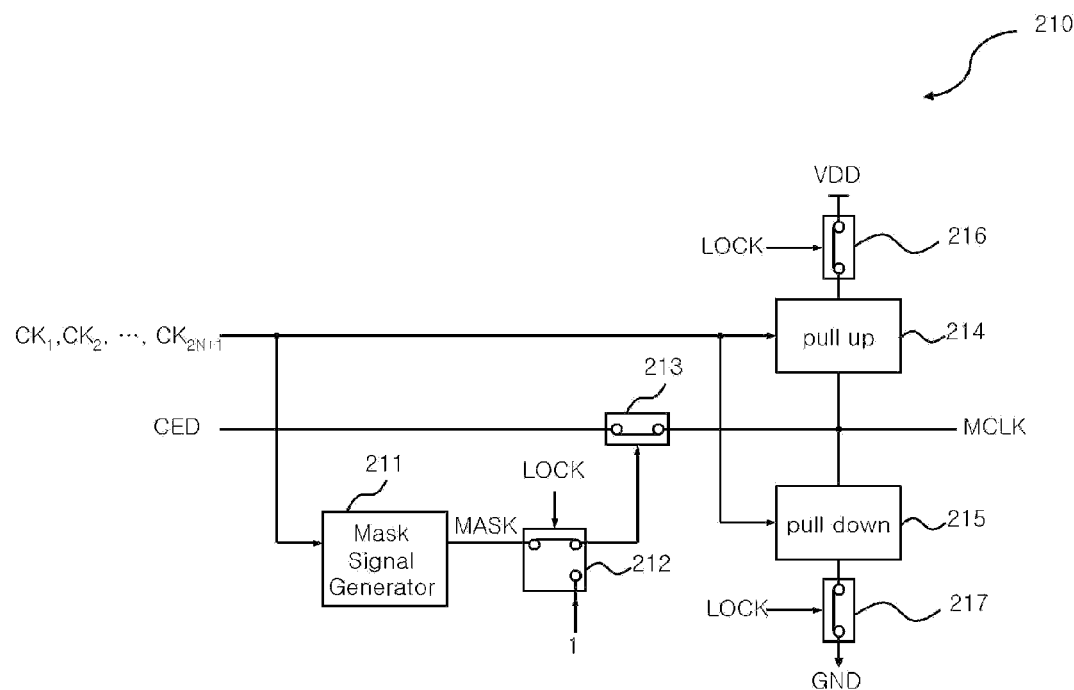
FIG. 4 is a configurational view of a clock generator in accordance with the embodiment of the present invention.

FIG. 4 is a configurational view of a clock generator in accordance with the embodiment of the present invention.

Referring to FIG. 4, the clock generator 210 includes a mask signal generator 211 configured to receive the delayed clock signals and generate a mask signal MASK; a pass switch 212 configured to switch a cutoff switch in response to the mask signal MASK and control the transmitting state of the clock embedded data (CED) signal; a cutoff switch 213 configured to cutoff direct transmission of the clock embedded data (CED) signal in response to the LOCK signal transmitted from the timing controller and the mask signal MASK; a pull-up section 214 and a pull-down section 215 configured to complementarily operate with respect to each other in response to at least one signal of the delayed clock signals $CK_1$, $CK_2$ ... $CK_{2N+1}$ when the cutoff switch 213 is turned off and generate and output the master clock signal MCLK; and a first switch 216 configured to connect one end of the pull-up section 214 to a power supply voltage VDD and a second switch 217 configured to connect one end of the pull-down section 215 to a ground voltage GND. At this time, the LOCK signal is a signal that informs the ending of the clock training interval, and indicates that the operation of the delay locked loop is stabilized or an external input signal is stabilized.

The mask signal generator 211 comprises a masking circuit which receives the delayed clock signals $CK_1$, $CK_2$ ... $CK_{2N+1}$) outputted after being delayed through a plurality of inverters in the delay line 220 so as to recover clock signals embedded with the clock embedded data (CED) signal and detects the rising edges or the falling edges of the clock signals.

The pass switch 212 is switched in response to the LOCK signal and controls the operation of the cutoff switch 213 so that the mask signal MASK for detecting the edges of the clock signals embedded in the clock embedded data (CED) signal can be transmitted. The pass switch 212 has one end which is connected to the mask signal generator 211 and the other end which is connected to the cutoff switch 213 for cutting off the transmission of the clock embedded data (CED) signal as the output of the clock generator 210.

At this time, the pass switch 212 is configured in such a manner that the mask signal MASK is connected to the cutoff switch 213 in response to the LOCK signal or the logic value of "1", that is, a value indicating a logic high state is connected to the cutoff switch 213. In other words, in the case where the LOCK signal is in a logic high state, the cutoff switch 213 operates by the mask signal MASK, and in the case where the LOCK signal is in a logic low state, the first clock embedded data (CED) signal is outputted as a first master clock signal MCLK.

Also, the cutoff switch 213 has one end which is connected to a signal line connected to the receiver and the other end which is connected to the delay line 220. The cutoff switch 213 is configured to control the direct transmission of the a first clock embedded data (CED) signal as a first master clock signal MCLK to the delay line 220 and receive the mask signal MASK for detecting edges of a clock signal embedded in a second clock embedded data (CED) signal, from the pass switch 212.

The other end of the cutoff switch 213 is connected as well to the connection node of the pull-up section 214 and the pull-down section 215 which is connected to the delay line 220, and cuts off the output of a second clock embedded data (CED) signal and outputs a second master clock signal (MCLK) recovered by pull-up or pull-down operation.

Hence, the cutoff switch 213 is configured to operate by the mask signal MASK transmitted from the pass switch 212 and be controlled to detect the rising edge or the falling edge of the clock signal embedded in the second clock embedded data (CED) signal when the LOCK signal is in a logic high state, and operate by the logic value "1" and allow the first clock embedded data (CED) signal to be outputted as a first master clock signal MCLK when the LOCK signal is in a logic low state.

Since the state in which the LOCK signal is in the logic low (L) state corresponds to the clock training interval, the pass switch 212 is connected to the logic value of "1", and the cutoff switch 213 transmits the first clock embedded data (CED) signal as a first master clock signal MCLK irrespective of the logic state of the mask signal MASK. Thus, the clock signal of a first clock embedded data (CED) signal transmitted from the clock generator 210 during the clock training interval is transferred to the delay line 220 as a first master clock signal (MCLK).

Namely, while a signal having a period corresponding to the period of the clock signal inserted between the data signals when the timing controller transmits the signal is needed to recover the edges of the clock signal embedded in a second clock embedded data (CED) signal, the signal can be obtained, without using a separate oscillator for generating a reference clock signal, by outputting, as it is, a first clock embedded data (CED) transmitted during the clock training interval, from the clock generator 210. A signal obtained at this time is a first master clock signal (MCLK). A first master clock signal (MCLK) is transferred to the delay line 220 comprising a voltage-controlled delay line (VCDL) or a current-controlled delay line (CCDL).

However, in the case where the LOCK signal is in a logic high (H) state, the transmission of the clock embedded data (CED) signal is controlled by the mask signal MASK which is generated by the mask signal generator 211, the rising edge or the falling edge of the clock signal embedded in the clock embedded data (CED) signal is detected. That is to say, during the interval in which the mask signal MASK is in the logic high (H) state, the edge of the clock signal embedded in clock embedded data (CED) signal is transferred while being detected. However, during the interval in which the mask signal MASK in the logic low (L) state, the cutoff switch 213 is operated such that the clock embedded data (CED) signal from being transferred as it is, is prevented and the remaining portion of excluding the edge of the clock signal embedded in the clock embedded data (CED) signal is recovered through the operation of the pull-up section 214 or the pull-down section 215 using at least one delayed clock signal.

The pull-up section 214 and the pull-down section 215 generate the pull-up signal PU or the pull-down signal PD by using or combining at least one signal of the delayed clock signals $CK_2, CK_2 \ldots CK_{2N+1}$ when the LOCK signal is in the logic high state and the mask signal MASK is in the logic low state, thereby implementing the pull-up and pull-down operations and recovering the remaining portion excluding the edge of the clock signal embedded in the clock embedded data (CED) signal.

The pull-up section 214 is connected at one end thereof to the power supply voltage VDD through the first switch 216, and the pull-down section 215 is connected to the ground voltage GND through the second switch 217. The first switch 216 and the second switch 217 are controlled by the LOCK signal such that they are turned off when the LOCK signal is in the logic low (L) state and are turned on when the LOCK signal is in the logic high (H) state.

Accordingly, when the LOCK signal is in the logic low state, the first switch 216 prevents the pull-up section 214 from being connected to the power supply voltage VDD and the second switch 217 prevents the pull-down section 215 from being connected to the ground voltage GND. Also, when the LOCK signal is in the logic high state, the first switch 216 connects the pull-up section 214 to the power supply voltage VDD, and the second switch 217 connects the pull-down section 215 to the ground voltage GND.

In this way, due to the fact that the operations of the first switch 216 and the second switch 217 are controlled by the LOCK signal, when the LOCK signal of the delay locked loop (DLL) is in the logic low (L) state, it is possible to prevent the master clock signal MCLK from being erroneously generated due to the mis-operation of the pull-up section 214 and the pull-down section 215.

Hence, the pull-down signal PD outputs as an output the voltage value of the ground voltage GND when an input corresponds to a logic low output since the pull-up section 214 is turned off and a path is not formed between the power supply voltage VDD and the ground voltage GND, and the pull-up signal PU outputs as an output the voltage value of the power supply voltage VDD when an input corresponds to a logic high output since the potential of the output node thereof is raised to the power supply voltage, the pull-down section 215 is turned off and a path is not formed from the power supply voltage VDD to the ground voltage GND. A value determined by the switching operations of the pull-up section 214 and the pull-down section 215 is outputted as a second master clock signal MCLK and is transferred to the delay line 220.

The delay line 220 may comprise a voltage-controlled delay line (VCDL) or a current-controlled delay line (CCDL). The delay line 220 is configured based on the delay locked loop (DLL) in such a manner that they do not have a feedback loop by which the delayed clock signals outputted are inputted again, and have a plurality of delay means capable of receiving, delaying and then outputting the master clock signal MCLK outputted from the clock generator 210.

Hereafter, the delay line will be stated as, but not limited to, the voltage-controlled delay line 220. Also, while it is illustrated in FIG. 3 that the delay means comprise inverters, it is to be noted that the delay means are not limited to the inverters but may comprise other delay cells or delay elements.

The delay line 220 generates a first delay clock signal by delaying a first master clock signal MCLK outputted from the clock generator 210 during the clock training interval. Further, the delay line (220), after the clock training period ends, generates a second delay clock signal by receiving and delaying the signal obtained by recovering the remaining portion excluding the edges of the clock signal included in the second clock embedded data (CED) signal through the operations of the pull-up section and the pull-down section using the master clock signal MCLK.

The plurality of inverters provided to the delay line 220 have a delay unit that is composed of a pair of inverters, and generate and output the delayed clock signals CK1, CK2, CK3, ... $CK_{2N+1}$ through pairs of inverters.

At this time, as the delayed clock signals outputted from the delay line 220 are transmitted to the clock generator 210, the remaining portion of the clock signal excluding the portion inserted between the data can be recovered. That is to say, the delayed clock signals comprise a clock signal that is delayed while passing through the pair of inverters, and optional clock signals selected among delay clock signals are inputted to the clock generator 210, such that, when the LOCK signal is in the logic high state and the mask signal MASK is in the logic low state, the remaining portion of the clock signal excluding the edge of the clock signal embedded in the clock embedded data (CED) signal can be recovered by operating the pull-up section 214 or the pull-down section 215.

Optional two clock signals among the master clock signal (MCLK) as an input signal of the delay line 220 and the delay clock signals delayed by the delay line 220 are transmitted to the phase difference detector 230 such that the delay amounts of the clock signals delayed while passing through the inverters can be compared.

The phase difference detector 230 has as its inputs optional two clock signals among the master clock signal (MCLK) as an input signal of the delay line (220) and the clock signals delayed by delay line (220) and is configured to generate the up/down signal UP/DN as a delay amount control signal corresponding to the time difference between the two clock signals and output the up/down signal UP/DN to the low pass filter 240.

At this time, when the LOCK signal is in the logic high state and the delay locked loop (DLL) is locked, the phase difference detector 230 has, as its inputs being comparison targets, two optional signals among the master clock signal MCLK outputted from the clock generator 210 and the delayed clock signals $CK_1, CK_2, CK_3, \ldots, CK_{2N+1}$ of which time difference is the same as the period at which the clock bits are inserted. While it is illustrated in FIG. 4 that the phase difference detector 230 has as its two inputs a first delayed clock signal $CK_1$ delayed first and a $2N+1^{st}$ delayed clock signal $CK_{2N+1}$ delayed while passing through all of the plurality of pairs of inverters provided in the delay line and is configured to generate the up/down signals depending upon the time difference between these two input clock signals, it is to be appreciated that the two delayed clock signals selected as the inputs to the phase difference detector 230 are not limited to these two clock signals.

Namely, when the time difference between the first delayed clock signal $CK_1$ and the $2N+1^{st}$ delayed clock signal $CK_{2N+1}$ corresponds to the up signal UP as a positive signal, a low pass filter 240 as a charge pump charges electric charges, and when the time difference corresponds to the down signal DN as a negative signal, the low pass filter 240 as the charge pump discharges electric charges, thereby controlling the delay amount in the delay line 220.

The low pass filter 240 supplies a signal capable of adjusting a delay amount of the delay line by removing or reducing the high frequency component of the up/down signal UP/DN.

While it is illustrated in the embodiment that the low pass filter 240 comprises the charge pump, it is to be appreciated that the low pass filter 240 is not limited to such and may comprise various loop filters.

In FIG. 3, in order for the low pass filter 240 to receive the up/down signal UP/DN and output the voltage control signal VCTRL for adjusting the delay amount of the delay line 220, the output terminal of the low pass filter 240 is connected to the inverters provided to the delay line 220. Accordingly, the low pass filter 240 removes or reduces the high frequency component of the up/down signal generated by the time difference between the two clock signals in the phase difference detector 230, and outputs the voltage control signal VCTRL.

Figure 5:
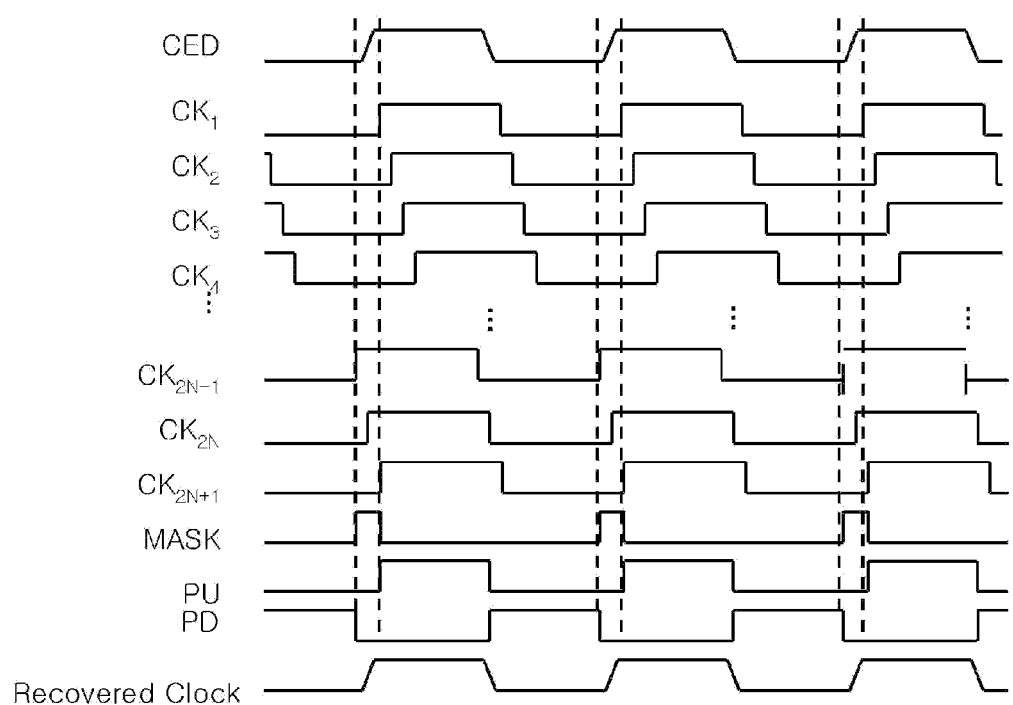
FIGS. 5 and 6 are timing diagrams illustrating operations of the clock recovery unit in accordance with the embodiment of the present invention.

FIG. 5 is a timing diagram illustrating the operation of the clock recovery unit in accordance with the embodiment of the present invention.

Referring to FIG. 5, in order to recover the rising edge or falling edge of the clock signal inserted between the clock embedded data (CED), a first clock embedded data (CED) signal including a clock signal that has a period corresponding to the period of a clock signal to be recovered, when initially recovering, is needed. Therefore, during the clock training interval in which the LOCK signal is in a logic low state, the first clock embedded data (CED) signal transmitted from the transmitter is outputted as it is as a first master clock signal MCLK from the clock generator 210, and is transferred to the voltage-controlled delay line 220. During the clock training interval, the LOCK signal is changed from the logic low (L) state to the logic high (H) state. Even though a separate oscillator is not provided, a first master clock signal (MCLK) to be used for the recovery of the clock signal can be generated during the clock training interval.

In order to recover the clock signal embedded in the clock embedded data (CED) signal, using at least one delay clock signal delayed by the delay line 220, the mask signal MASK for detecting the rising edge or the falling edge of the clock embedded data (CED) signal, and the pull-up signal PU and the pull-down signal PD for driving the pull-up section 214 and the pull-down section 215 to generate the remaining portion of the clock signal excluding the portion detected by the mask signal MASK are generated.

As shown in FIG. 5, if the delayed clock signal is delayed little by little by an amount delayed in the respective delay means and the transition timings of the first delayed clock signal $CK_1$ and the $2N+1^{st}$ delayed clock signal $CK_{2N+1}$ correspond to each other, the up/down signal is not needed and a current state can be maintained. However, if the transition timings of the two signals do not correspond to each other and a phase difference occurs between the two signals, a delay amount is adjusted by the voltage control signal VCTRL that is generated through charge and discharge in the loss pass filter 240.

FIG. 5 illustrates that a mask signal (MASK) is generated by being synchronized and combined with a rising edge of a $2N-1^{st}$ delayed clock signal $CK_{2n-1}$ and a $2N+1^{st}$ delayed clock signal $CK_{2n+1}$. That is to say, FIG. 5 illustrates a mask signal (MASK) generated by selecting two delay clock signals that an edge of a clock signal is located within a phase difference of two signals among delay clock signals $CK_1, CK_2, CK_3 \ldots CK_{2N+1}$.

Also, FIG. 5 illustrates that a pull-up signal PU is generated by being synchronized with a rising edge of a $2N+1^{st}$ delayed clock signal $CK_{2n+1}$ and a pull-down signal PD is generated by being synchronized with a rising edge of a $2N-1^{st}$ delayed clock signal $CK_{2n-1}$. That is to say, FIG. 5 illustrates a pull-up signal PU for generating a signal after an edge using a $2N+1^{st}$ delayed clock signal $CK_{2n+1}$ having a rising edge which is the same as the end timing of a mask signal (MASK) and illustrates a pull-down signal PD for finishing a recovery of a clock signal using a $2N-1^{st}$ delayed clock signal $CK_{2n-1}$ having a rising edge which is the same as the end timing of a $2N+1^{st}$ delayed clock signal $CK_{2n+1}$ used as a pull-up signal PU.

Only when both the LOCK signal and the mask signal MASK generated in the mask signal generator 211 are in the logic high state, the edge of the clock signal embedded in clock embedded data (CED) signal is detected, and if the mask signal MASK is in the logic low state, the remaining portion of the clock signal excluding the edges is recovered by the pull-up signal PU and the pull-down signal PD for operating the pull-up section 214 and the pull-down section 215.

Hence, it is possible that an embedded clock signal is recovered in the clock embedded data (CED) signal having the same level and amplitude as the data signal while preventing jitter from accumulating through nonuse of a separate phase fixed loop and not using a separate internal oscillator and recovery clock signal can be outputted.

Figure 6:
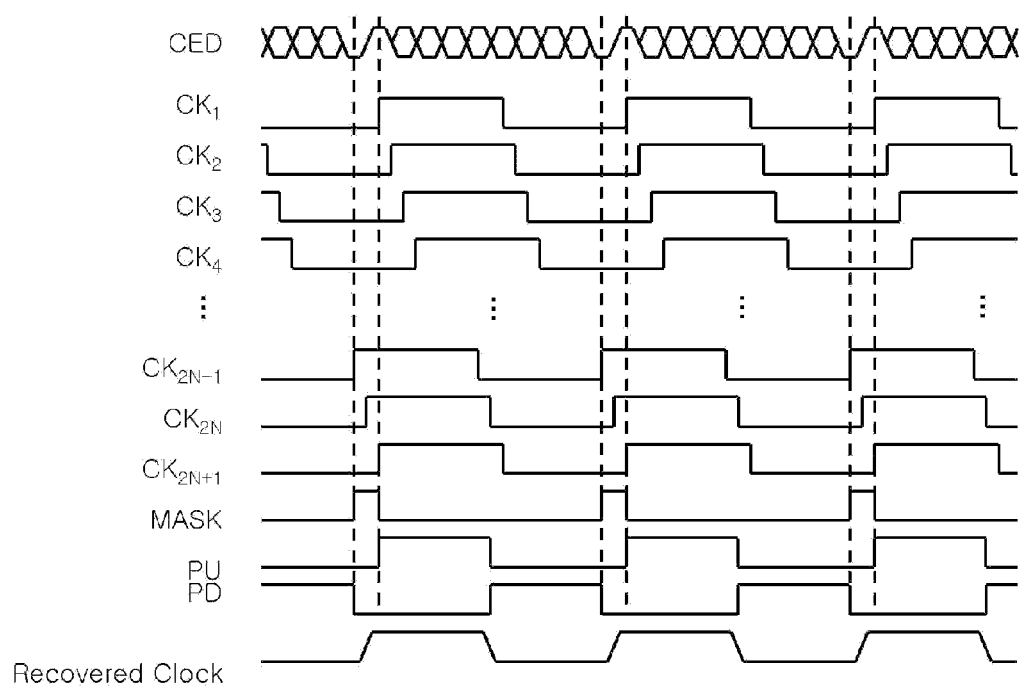

FIG. 6 is a timing diagram illustrating another operation of the clock recovery unit in accordance with the embodiment of the present invention.

Referring to FIG. 6, in order to recover the clock signal embedded in the clock embedded data (CED) signal as described above, the mask signal MASK for detecting the rising edge or falling edge of the clock signal embedded in the clock embedded data (CED) signal using at least one first delay clock signal generated through delaying and outputting the input signal (the CED signal) during the clock training interval by the delay line 220, and the pull-up signal PU and the pull-down signal PD for generating the remaining portion excluding the portion detected by the mask signal MASK are generated.

The clock embedded data (CED) signal shown in FIG. 6 is illustrated having a dummy bits preceding the clock signal. When both the LOCK signal and the mask signal MASK are in the logic high state, the transition of the clock signal embedded after the dummy bit is perceived, so that the rising edge or falling edge of the clock signal embedded in the clock embedded data (CED) signal is detected. At this time, depending upon whether the rising edge or the falling edge of the clock embedded data (CED) signal is detected, the sequence of the pull-up signal PU and the pull-down signal PD for driving the pull-up section 214 and the pull-down section 215 can be changed.

In these ways, in the present invention, the receiver generates the initial master clock signal to be used in the receiver, using the first clock embedded data (CED) signal transmitted during the clock training interval, detects the edge of the clock signal embedded between data signals to the same level, using the mask signal generated by the initial first master, generates a second master clock signal by recovering the remaining portion of the clock signal excluding the portion detected in this manner, and selects a second delay clock signal that a second master clock signal is delayed to output the recovery clock signal. As a consequence, the clock signal can be outputted from the output signal, that is to say, delay clock signals of the voltage-controlled delay line 220 based on the delay locked loop (DLL) without using the phase locked loop (PLL) for generating the internally oscillating clock signal.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A receiver comprising a clock recovery unit configured to recover and output a clock signal, and a serial-to-parallel converter configured to recover and output a data signal, wherein the clock recovery unit is configured to:
   receive a clock embedded data signal in which only the clock signal is included during a clock training interval and the clock periodically embedded between the data signals after the clock training interval;
   generate a first master clock signal from the clock embedded data signal during the clock training interval;
   generate a second master clock signal from the clock embedded data signal after the clock training interval;
   after the training interval, generate the second master clock signal by a first delay clock signal that delays the first master clock signal so as to have a phase difference and then generates the second master clock signal by a second delay clock signal that delays the second master clock signal so as to have a phase difference; and
   provide a recovery clock signal from the second delay clock signals, and wherein the clock recovery unit is configured based on a delay locked loop.

2. The receiver according to claim 1, wherein the clock recovery unit comprises:
   a clock generator configured to output the clock embedded data signal inputted during the clock training interval as the first master clock signal, and to recover and output the clock signal embedded in the data signals of the clock embedded data (CED) signal inputted by the first delay clock signals and the second delay clock signals sequentially generated after the clock training interval as the second master clock signal;
   a delay line having a plurality of delay means, outputting as the first delay clock signals having a phase difference by delaying the first master clock signal, and outputting as the second delay clock signals having a phase difference by delaying the second master clock signal;
   a phase difference detector configured to generate an up/down signal that detects a time difference or a phase difference between two signals selected among any one of the first and master clock signal and the first delay clock signals or the second master clock signal and the second delay clock signals; and
   a low pass filter configured to provide a voltage control signal for controlling the delay amounts of the delay line in response to the up/down signal in the phase difference detector.

3. The receiver according to claim 2, wherein the clock generator comprises:
   a mask signal generator configured to receive the first and second delay clock signals, and generate a mask signal for detecting an edge of the clock signal embedded in the data signals of the clock embedded data (CED) signal;
   a pass switch configured to output the mask signal or a fixed logic state value by a LOCK signal that distinguishes the clock training interval;
   a cutoff switch configured to output clock embedded data (CED) signal as the first master clock signal in response to the clock training interval by the fixed logic state value applied from the pass switch, and output as the second master clock signal by detecting an edge of the clock signals embedded in the data signals of the clock embedded data (CED) signal after the clock training interval by the mask signal; and
   a pull-up section and a pull-down section configured to complementarily operate by at least one signal of the first and master clock signal and the first delay clock signals or the second master clock signal and the second delay clock signals and recover the signal after the edge when the cutoff switch is turned off by the mask signal, and output as the second master clock signal.

4. The receiver according to claim 3, wherein the pass switch perceives a logic low state of the LOCK signal as the clock training interval and applies the value indicating the logic high state as the fixed logic value, as the cutoff switch; and wherein the cutoff switch outputs the clock embedded data (CED) signal of the value indicating the logic high state from the pass switch as it is, as the first master clock signal (MCLK) and transmits the clock embedded data (CED) signal to the delay line.

5. The receiver according to claim 3, wherein the pass switch applies the mask signal as the cutoff switch when the LOCK signal is in the logic high state; and wherein the cutoff switch detects the edge of the clock signal of the clock embedded data (CED) signal during an interval in which the mask signal is in the logic high state and outputs a detection result to the delay line, prevents the clock embedded data (CED) signal from being transferred when the mask signal is in a logic low state.

6. The receiver according to claim 2, comprising delay means having a number equal to or greater than 2N+1 and the N is a natural number indicating a number of data bits that exist in the clock bits periodically embedded in the clock embedded data (CED) signal.

7. The receiver according to claim 2, wherein the delay line comprises a voltage-controlled delay line or a current-controlled delay line.

8. The receiver according to claim 2, wherein the delay means comprise inverters.

9. The receiver according to claim 2, wherein the low pass filter comprises a charge pump which has an output terminal connected to the delay line.

10. The clock recovery unit according to claim 1, comprising the clock embedded data (CED) signal in which the clock signal having the same amplitude and level as the data signals is periodically embedded between the data signals.

11. A clock recovery circuit comprising:

a clock generator configured to output master clock signal when a first clock embedded data signal including clock signal is inputted or a second clock embedded data signal that the clock signal is embedded in data signal is inputted;

a delay line configured to generate delayed clock signals from the master clock signal when the master clock signal is inputted; and wherein the clock recovery circuit is configured to recover clock signal included in the first clock embedded data signal or the second clock embedded data signal by detecting transition edge of the first clock embedded data signal or the second clock embedded data signal using at least one of the delay clock signals.

12. The clock generator according to claim 11 is configured to, output a first master clock signal when the first clock embedded data signal is inputted;

output a second master clock signal when the second clock embedded data signal is inputted;

carry out a first recovery operation outputting the first master clock signal recovered from the first clock embedded data (CED) signal by detecting transition edge of the first clock embedded data (CED) signal using at least one of the delay clock signals; or carry out a second recovery operation outputting the second master clock signal recovered from the second clock embedded data (CED) signal by detecting transition edge of the second clock embedded data (CED) signal using at least one of the delay clock signals.

13. The clock recovery circuit according to claim 12, wherein the first recovery operation is carried out during a training interval of the clock signal.

14. The clock recovery circuit according to claim 11, wherein the recovered clock signal is one of the delay clock signals or the master clock signal.

15. A clock recovery unit comprising:

a clock generator outputting a master clock signal when clock embedded data (CED) signal is inputted;

a delay line generating delay clock signals delayed from the master clock signal; and a phase difference detecting circuit comparing optional two signals among the delay clock signals and controlling the delay amounts of the delay lines in response to the phase difference; and wherein the clock recovery unit is configured to recover clock signal included in the clock embedded data signal by detecting transition edge of the clock embedded data (CED) signal using at least one of the delay clock signals.

* * * * *